United States Patent [19]
Ko et al.

[11] Patent Number: 6,156,644
[45] Date of Patent: *Dec. 5, 2000

[54] METHOD FOR FORMING INTERCONNECTS FOR SEMICONDUCTOR DEVICES USING REACTION CONTROL LAYERS, AND INTERCONNECTS FORMED THEREBY

[75] Inventors: Kwang-man Ko, Seoul; Sang-in Lee, Kyungki-do, both of Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/760,594

[22] Filed: Dec. 4, 1996

[30] Foreign Application Priority Data

Dec. 7, 1995 [KR] Rep. of Korea ............. 95-47455

[51] Int. Cl.[7] .................. H01L 21/44; H01L 21/4763; H01L 29/40
[52] U.S. Cl. .................. 438/639; 438/629; 438/637; 438/642; 438/643; 438/648; 438/649; 438/652; 438/655; 438/656; 438/663; 438/664; 257/750; 257/751; 257/754; 257/757
[58] Field of Search .................. 438/639, 653, 438/305, 303, 649, 669, 297, 643, 655, 672, 675; 257/751, 763, 915, 770; 204/192

[56] References Cited

U.S. PATENT DOCUMENTS

| | | | |
|---|---|---|---|
| 4,502,209 | 3/1985 | Eizenberg et al. | 438/639 |
| 4,675,073 | 6/1987 | Douglas | 156/643 |
| 4,746,219 | 5/1988 | Holloway et al. | 357/23.11 |
| 4,784,973 | 11/1988 | Stevens et al. | 438/653 |
| 4,804,636 | 2/1989 | Grover, III et al. | 438/275 |
| 4,957,590 | 9/1990 | Douglas | 438/669 |
| 4,975,756 | 12/1990 | Haken et al. | 357/4.1 |
| 4,994,402 | 2/1991 | Chiu | 438/297 |
| 5,010,032 | 4/1991 | Tang et al. | 438/228 |
| 5,162,262 | 11/1992 | Ajika et al. | 438/649 |
| 5,449,631 | 9/1995 | Giewont et al. | 438/303 |
| 5,545,574 | 8/1996 | Chen et al. | 438/297 |
| 5,612,253 | 3/1997 | Farahani et al. | 438/643 |
| 5,744,395 | 4/1998 | Shue et al. | 438/305 |
| 5,766,997 | 6/1998 | Takeuchi | 438/257 |
| 5,776,830 | 7/1998 | Sumi et al. | 438/643 |

Primary Examiner—Tom Thomas
Assistant Examiner—Bernard E. Souw
Attorney, Agent, or Firm—Myers Bigel Sibley & Sajovec

[57] ABSTRACT

Interconnects for semiconductor devices are formed by forming a reaction control layer on a lower conductive layer of a semiconductor device, forming a reactive metal layer on the reaction control layer, opposite the lower conductive layer, reacting the lower conductive layer with the reactive metal layer, through the reaction control layer, to form an ohmic contact for the semiconductor device, and forming an upper conductive layer on the ohmic contact, opposite the lower conductive layer. Interconnects so formed may provide reduced contact resistance and reduced agglomeration of the ohmic contact region, independent of reaction temperatures. The reactive metal layer is preferably a refractory metal and the reaction control layer is preferably a refractory metal compound. The upper conductive layer is also preferably a refractory metal.

35 Claims, 11 Drawing Sheets

TiN
TiSix
Si

TiN
TiSix
Si

METHOD FOR FORMING INTERCONNECTS FOR SEMICONDUCTOR DEVICES USING REACTION CONTROL LAYERS, AND INTERCONNECTS FORMED THEREBY

FIELD OF THE INVENTION

This invention relates to semiconductor devices and manufacturing methods therefor, and more particularly to interconnects for semiconductor devices and manufacturing methods therefor.

BACKGROUND OF THE INVENTION

Integrated circuit devices generally include a large number of semiconductor devices such as transistors which are interconnected to perform predetermined functions. As is well known to those having skill in the art, the integration density of integrated circuits generally continues to increase, so that smaller and smaller devices are generally formed. The contact resistance of the electrical interconnects of the semiconductor devices should preferably be reduced as the integration density continues to increase.

The contact resistance of an interconnect is determined, at least in part, by the material which is used. Accordingly, many interconnect materials have been investigated for semiconductor devices. For example, a polycide contact, which is formed from polysilicon and a metal silicide, generally has a low contact resistance and excellent stability. Accordingly, polycides are widely used for interconnects for semiconductor devices. In particular, tungsten polycide including a polysilicon layer and a tungsten silicide layer, is widely used to form semiconductor device interconnects.

Unfortunately, polycide has a resistivity which is generally higher than that of a single metal. Tungsten polycide therefore may not be optimal for forming ohmic contacts with a silicon-based semiconductor device, such as N+ type and P+ type silicon. Accordingly, metal interconnects are being investigated as a replacement for polycide interconnects.

When a metal interconnect is used for a semiconductor device, it is important that the interconnect maintain stability and satisfactory electrical performance after annealing. For example, when tungsten is used as a metal interconnect for a semiconductor device, three layers are generally used. An ohmic contact region of titanium silicide is formed by reacting titanium with the silicon semiconductor device by annealing. A diffusion barrier layer formed of titanium nitride is deposited on the ohmic contact region. A conductive layer formed of tungsten is then deposited on the diffusion barrier.

The titanium silicide is generally formed by one of two processes. The first process forms titanium silicide having the meta-stable phase (C-49) using a first rapid thermal annealing (RTA) process of titanium at approximately 600° C., followed by wet etching of the remaining titanium layer. The second process forms the titanium silicide layer by changing the titanium silicide layer in the meta-stable phase (C-49) to a stable phase (C-54) using a second RTA process at approximately 800° C.

Unfortunately, in the process of forming a metal interconnect using a titanium silicide layer as described above, the electrical characteristics of the material may deteriorate. In particular, the titanium silicide layer which forms the ohmic contact region in the multi-layer contact is formed by a chemical reaction between silicon in the semiconductor device and titanium which is deposited thereon. Unfortunately, dopants from the silicon may diffuse through the interface between the silicon and the titanium. These dopants may continue to diffuse during the annealing process which forms the ohmic contact and their rate of diffusion generally increases as more heat is applied. The dopants tend to decrease the conductivity and increase the contact resistance of the metal interconnect.

Moreover, the high temperature annealing process may cause agglomeration of the titanium silicide in the ohmic contact region. As a result of this agglomeration, the conductive substrate thereby may come into direct contact with the diffusion barrier layer (for example titanium nitride). As the agglomeration increases, the contact resistance generally also increases.

FIG. 1 is a cross-sectional view of a metal interconnect for a semiconductor device. The contact of FIG. 1 may be formed by depositing a dielectric layer 15 on a semiconductor device 10. The dielectric layer includes a contact hole which exposes a portion of the semiconductor device. The semiconductor device preferably includes silicon, such as doped silicon or silicide. The contact hole may be formed by coating the dielectric layer 15 with a photoresist (not shown), photolithographically patterning the photoresist and then forming a contact hole by selectively etching the dielectric film and the exposed portion of the semiconductor device. The photoresist is then removed.

Continuing with the description of FIG. 1, a titanium layer is deposited on the dielectric film 15. A titanium silicide ohmic layer 20 is then formed having the meta-stable phase C-49, at the exposed portion of the semiconductor device 15. The titanium silicide ohmic contact 20 may be formed by performing a first rapid thermal annealing (RTA) process at approximately 600° C. The remaining titanium layer is then removed using wet etching. The titanium silicide ohmic contact 20 is then converted to the C-54 stable phase by performing a second RTA process at approximately 800° C. A diffusion barrier 25, for example titanium nitride, and a conductive layer 30, for example tungsten, are then deposited on the semiconductor device.

Unfortunately, dopants from the semiconductor device 10 may diffuse through the ohmic contact region 20 during the annealing process, and especially during the second RTA process which is performed at high temperature. This dopant diffusion may increase the contact resistance.

Moreover, the high temperature annealing process may cause agglomeration of the titanium silicide of the ohmic contact 20. Accordingly, the semiconductor device 10 containing silicon may directly connect with the diffusion barrier 25 comprising titanium nitride. The contact resistance may increase and the semiconductor device performance may degrade.

FIG. 2 is a line drawing of a TEM photograph which shows the agglomeration of titanium silicide of a metal interconnection structure of a conventional semiconductor device. As shown, a portion of the titanium silicide ohmic contact exhibits non-uniform thickness due to the agglomeration of the titanium silicide.

FIG. 3 graphically illustrates the contact resistance of a metal interconnection structure of a conventional semiconductor device as a function of annealing temperature and contact size. As shown, the contact resistance generally increases as the annealing temperature increases or the contact size decreases.

FIG. 4 graphically illustrates the contact resistance of a metal interconnect of a conventional semiconductor device. The specific example is an integrated circuit memory device bit line which contacts a silicon substrate and a gate line. The gate material, tungsten silicide, is widely used. Titanium silicide is formed by depositing a titanium layer on the tungsten silicide layer and annealing it at a predetermined temperature. As shown in FIG. 4, the contact resistance of the bit line and gate line generally increases as a function of the annealing processes. As also shown in FIG. 4, when titanium nitride is used instead of titanium on tungsten silicide, stable resistance can be provided regardless of annealing temperature.

Accordingly, notwithstanding the above improvements, a reduction of dopant diffusion and a reduction of agglomeration of an ohmic contact layer comprising titanium silicide is still needed, to provide high performance interconnects for semiconductor devices.

SUMMARY OF THE INVENTION

It is therefore an object of the present invention to provide improved interconnects for semiconductor devices and improved methods of forming interconnects.

It is another object of the present invention to provide interconnects and interconnect forming methods for semiconductor devices which reduce contact resistance.

It is yet another object of the present invention to provide interconnects and interconnect forming methods for semiconductor devices which reduce agglomeration.

These and other objects are provided, according to the present invention, by forming interconnects for a semiconductor device by reacting a lower conductive layer of the semiconductor device with a reaction metal layer through an intervening reaction control layer, to thereby form an ohmic contact for the semiconductor device. By forming an ohmic contact by reacting a lower conductive layer and a reaction metal layer through an intervening reaction control layer, low resistance interconnects may be provided with reduced agglomeration and reduced diffusion of dopants.

In particular, according to the present invention, interconnects are formed for a semiconductor device by forming a dielectric layer on a lower conductive layer of the semiconductor device. The dielectric layer includes a contact hole which exposes a portion of the lower conductive layer. The exposed portion of the lower conductive layer comprises silicon, for example a doped silicon region, or metal silicide. A reaction control layer, such as titanium nitride, is formed on the dielectric layer opposite the lower conductive layer and on the exposed portion of the semiconductor device. A reactive metal layer such as titanium is formed on the reaction control layer. The exposed portion of the lower conductive layer is reacted with the reactive metal layer through the reaction control layer, to form an ohmic contact in the contact hole on the exposed portion of the lower conductive layer. The reactive metal layer is then removed from the dielectric layer opposite the lower conductive layer. An upper conductive layer such as titanium is then formed on the ohmic contact. A diffusion barrier such as titanium nitride may be formed between the ohmic contact and the upper conductive layer. It will be understood that as used herein, the terms "lower" and "upper" conductive layers are used to identify first and second spaced apart conductive layers.

In specific embodiments of methods according to the present invention, the reactive metal layer and the upper conductive layer preferably are refractory metals (i.e. metals having high melting points), and more particularly may be selected from the group consisting of titanium, cobalt, tungsten, molybdenum, tantalum and zirconium. The reaction control layer also preferably comprises a refractory metal compound and more preferably a metal compound selected from a group consisting of titanium nitride, tungsten nitride, tantalum nitride and zirconium nitride. Alternatively, titanium nitride, tungsten carbide, tantalum carbide and zirconium carbide may be used. The reaction control layer is preferably thinner than the reactive metal layer.

Also preferably, the reacting step is performed in an inert gas atmosphere or in an antioxidizing atmosphere. The reacting step preferably includes rapid thermal annealing between about 600° C. and about 800° C. A diffusion barrier may be formed between the steps of removing the reactive metal layer and the step of forming an upper conductive layer. The reaction control layer is also preferably removed between the steps of removing the reactive metal layer and forming the upper conductive layer.

Metal interconnects for semiconductor devices according to the invention include a dielectric layer on a lower conductive layer of the semiconductor device. The dielectric layer includes a sidewall which defines a contact hole which exposes a portion of the lower conductive layer. An ohmic contact is located in the contact hole on the exposed portion of the lower conductive layer. A reaction control layer is located on the dielectric layer opposite the lower conductive layer, and on the dielectric layer sidewall. A reactive metal layer is located on the reaction control layer. An upper conductive layer is located on the ohmic contact and on the reactive metal layer, opposite the lower conductive layer.

The ohmic contact preferably comprises a meta-stable phase C-49 silicide or a stable phase C-54 silicide. The upper conductive layer preferably comprises a refractory metal, and more preferably titanium cobalt, tungsten molybdenum, tantalum and zirconium. The reaction control layer is also preferably a refractory metal compound, and more preferably titanium nitride, tungsten nitride, tantalum nitride or zirconium nitride. Alternatively, titanium carbide, tungsten carbide, tantalum carbide and zirconium carbide may be used.

A diffusion barrier layer may be located between the reaction control layer and the ohmic contact, and the upper conductive layer. The diffusion barrier layer also preferably comprises a refractory metal compound. Improved interconnections with reduced contact resistance are thereby provided.

DETAILED DESCRIPTION OF PREFERRED EMBODIMENTS

Figure 1:
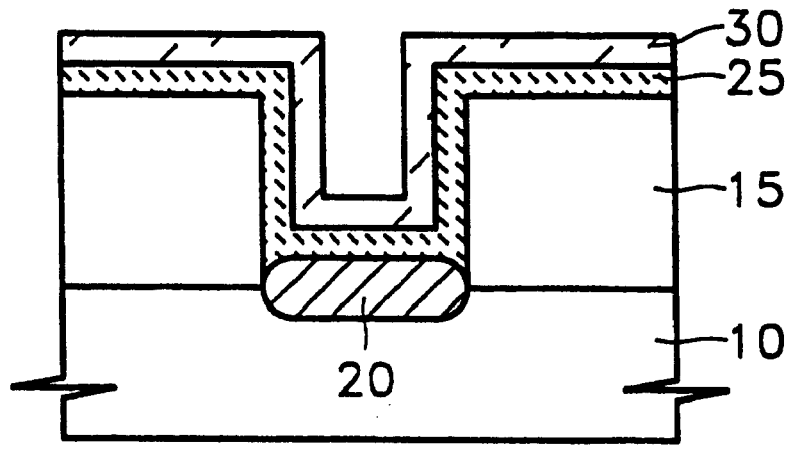
FIG. 1 is a cross-sectional view of a conventional interconnect for a semiconductor device.
Figure 2:
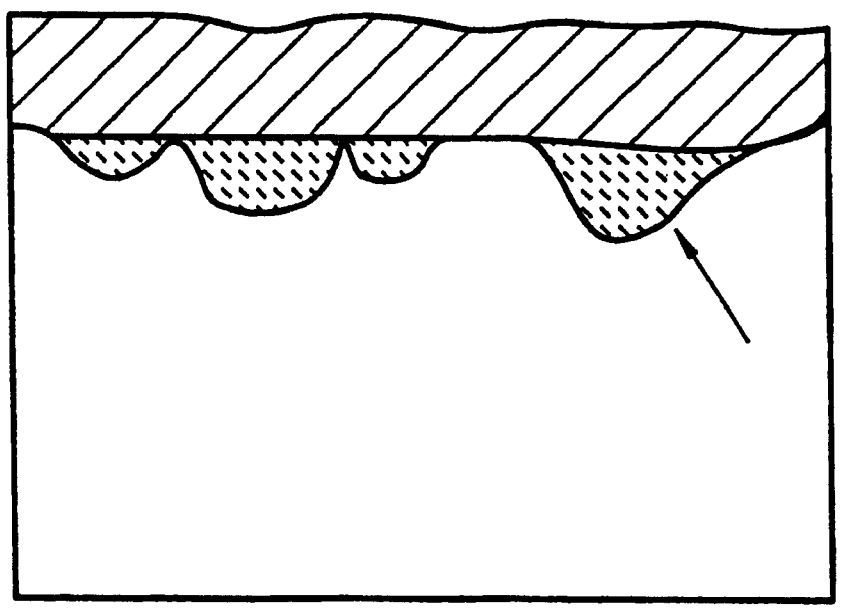
FIG. 2 is a line drawing of a TEM photograph which illustrates agglomeration of titanium silicide in a conventional interconnect.
Figure 3:
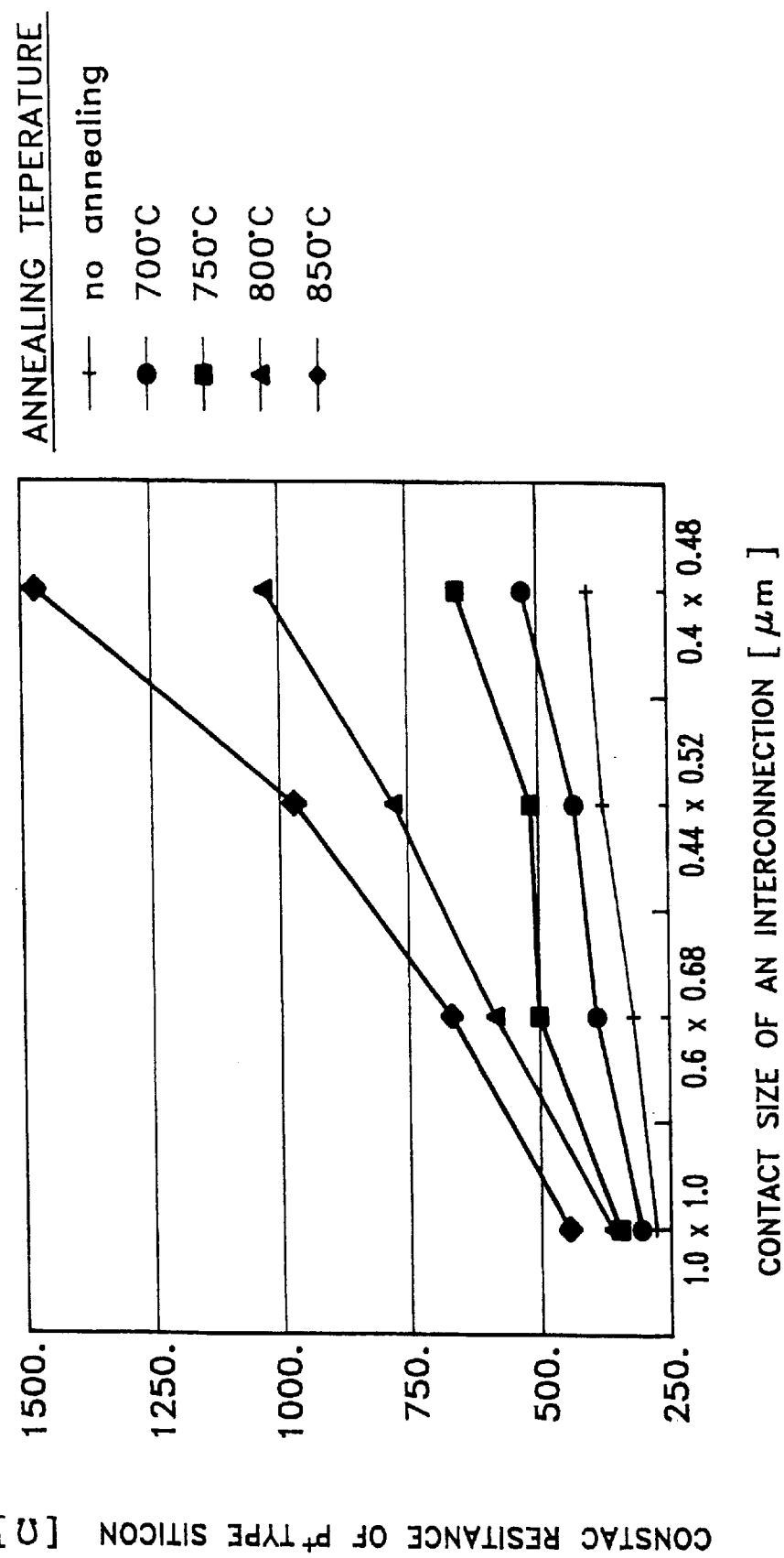
FIG. 3 graphically illustrates contact resistance of a contact as a function of contact size and annealing temperature.
Figure 4:
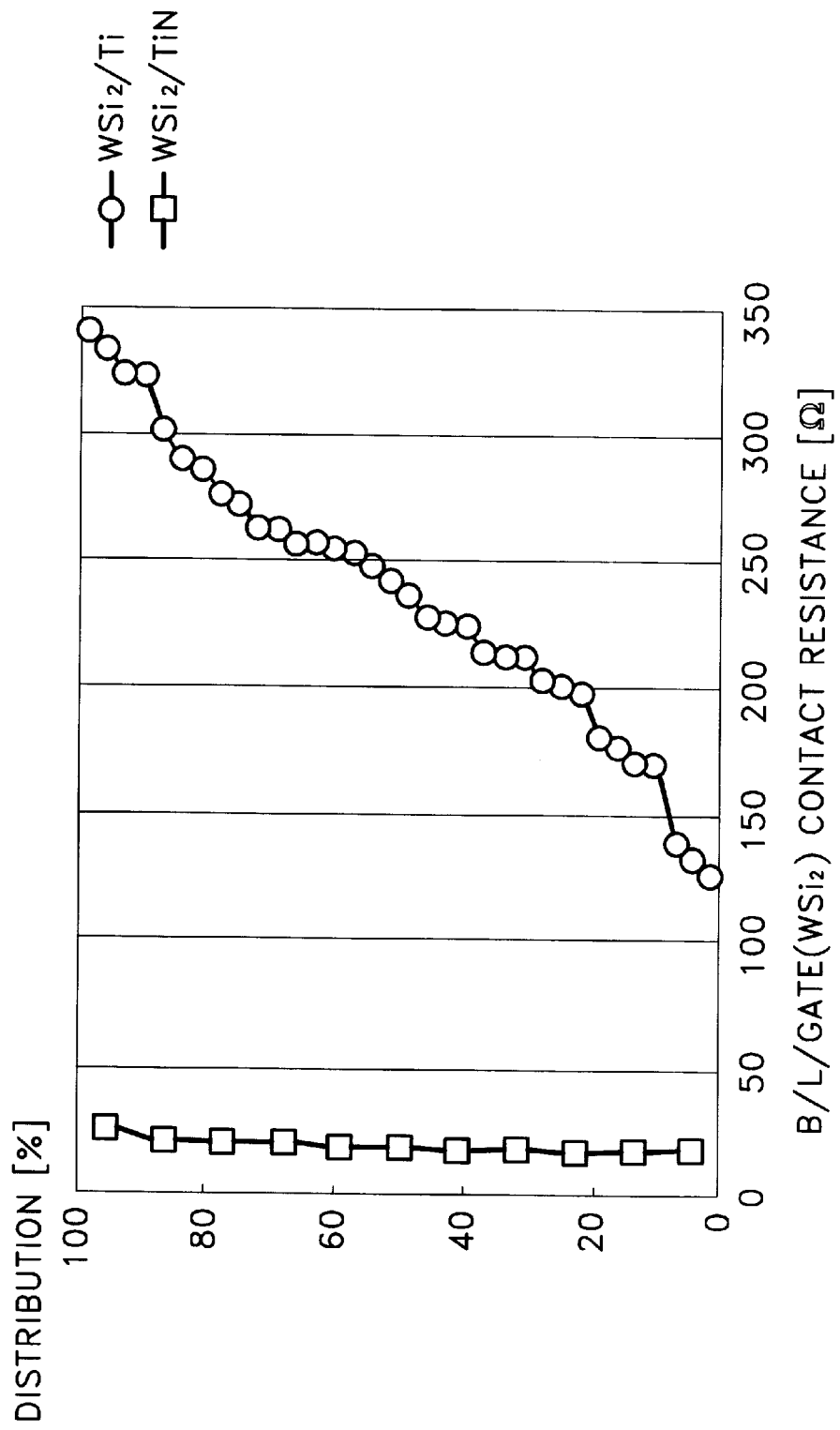
FIG. 4 graphically illustrates contact resistance of an interconnect.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity type embodiment as well. It will also be understood that when a layer is referred to as being "on" another layer, it can be directly on the other layer, or intervening layers may also be present.

Figure 5:
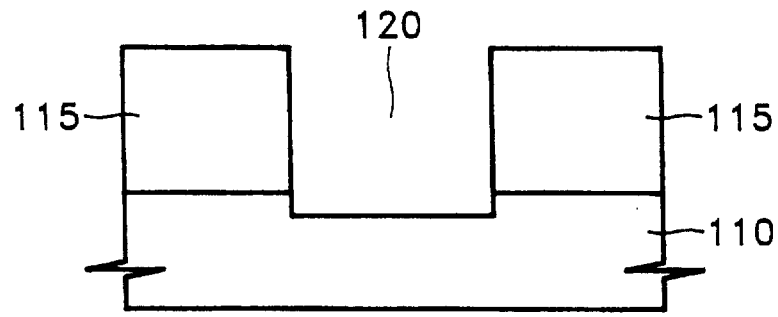
FIGS. 5–9 are cross-sectional views of a first embodiment of interconnects for semiconductor devices according to the present invention during intermediate fabrication steps.

Referring now to FIGS. 5–9, a first embodiment of interconnects for semiconductor devices according to the present invention is illustrated during intermediate fabrication steps. As shown in FIG. 5, a dielectric layer 115 is formed on a lower conductive layer 110 of a semiconductor device. The lower conductive layer 110 preferably includes silicon, such as doped silicon or metal silicide. The lower conductive layer 110 may be located on or in the semiconductor device. The dielectric layer is etched using photolithography or other conventional techniques to form a contact hole 120 which exposes a portion of the lower conductive layer 110. The exposed portion of the lower conductive layer may be a refractory metal silicide.

Figure 6:
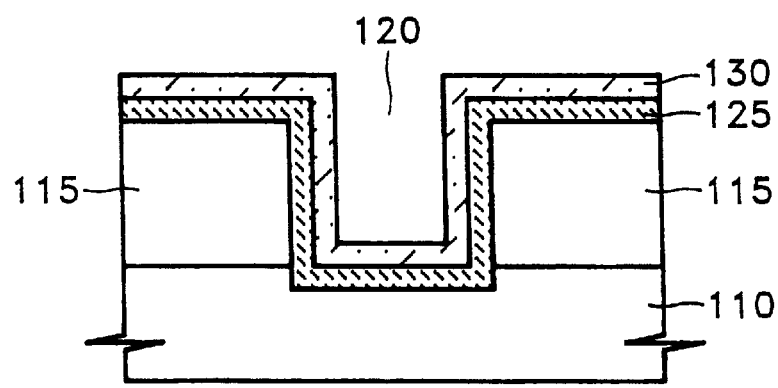

Referring now to FIG. 6, a reaction control layer 125 is formed on the dielectric layer opposite the lower conductive layer and on the exposed portion of the lower conductive layer. A reactive metal layer 130 is formed on the reaction control layer 125.

The reaction control layer 125 and the reactive metal layer 130 may be deposited by in situ deposition. The reaction control layer reduces reaction of the silicon contained in the lower conductive layer and the reactive metal layer 130. Accordingly, impurity diffusion may be reduced and low contact resistance may be maintained by controlling the silicide reaction independent of annealing temperature.

Still referring to FIG. 6, reaction control layer 125 comprises a refractory metal compound such as titanium nitride, tungsten nitride, tantalum nitride, zirconium nitride, titanium carbide, tungsten carbide, tantalum carbide or zirconium carbide. The reactive metal layer 130 preferably comprises a refractory metal such as titanium, cobalt, tungsten, molybdenum, tantalum or zirconium. Reaction control layer 125 is preferably thinner than reactive metal layer 130.

Figure 7:
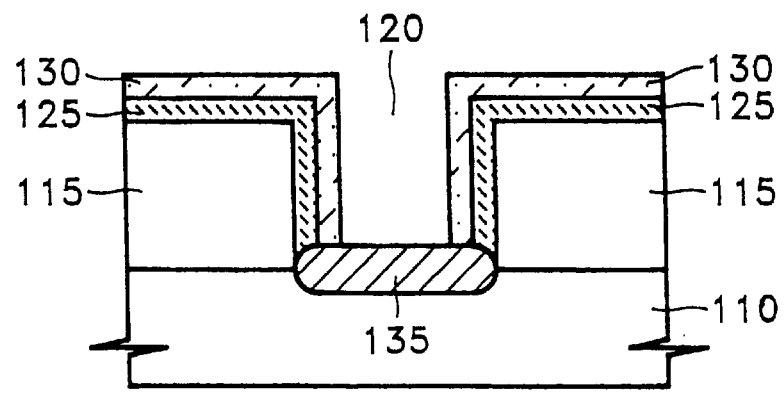

Referring now to FIG. 7, an ohmic contact 135 is formed by reacting the exposed portion of the lower conductive layer 110 with the reactive metal layer 130 through the reaction control layer 125. The ohmic contact is thereby formed in the contact hole on the exposed portion of the lower conductive layer. The ohmic contact 135 is preferably formed by annealing wherein the titanium in the reactive metal layer 130 reacts with silicon in the lower conductive layer 110, with the reaction control layer 125 located therebetween, to thereby form an ohmic contact comprising titanium silicide. Annealing is preferably performed in an inert gas atmosphere or in an antioxidizing atmosphere. The annealing is preferably performed by rapid thermal annealing between about 600° C. and about 800° C.

The ohmic contact 135 preferably has a uniform thickness due to the presence of the reaction control layer 125. The ohmic contact is preferably meta-stable phase C-49 silicide or stable phase C-54 silicide. Agglomeration due to the annealing process is reduced so that the lower conductive layer 110 does not directly contact a later formed upper conductive layer.

Figure 8:
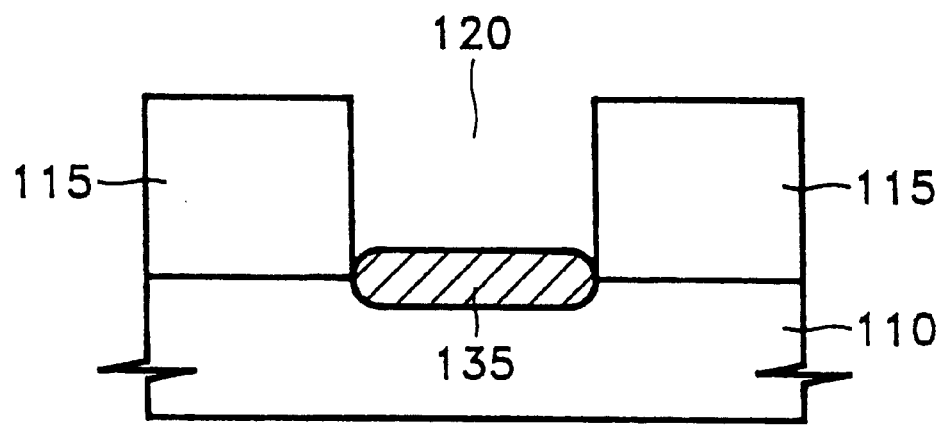

As shown in FIG. 8, the reactive metal layer 130 and the reaction control layer 125 may then be removed by wet etching or other conventional processes. If a thin oxide film is also formed on the ohmic contact 135, it can also be removed, to thereby further reduce the contact resistance.

Figure 9:
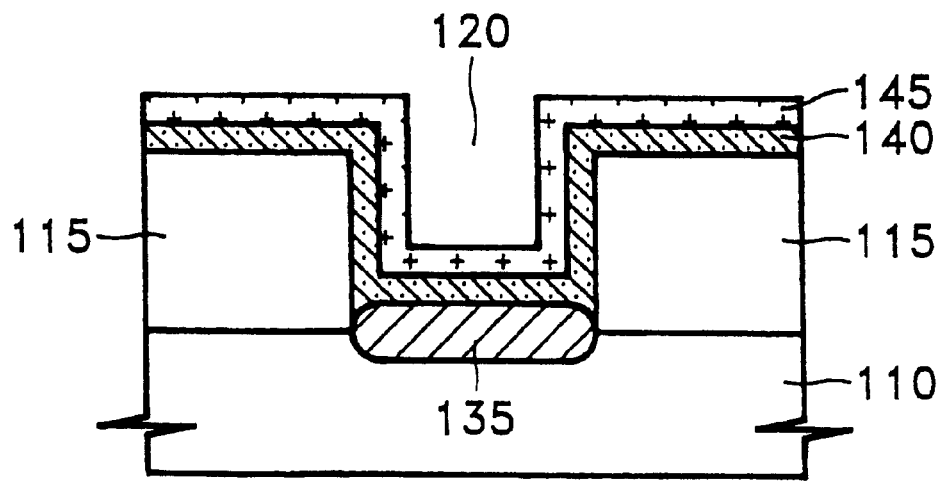

Referring now to FIG. 9, a diffusion barrier 140 is formed on the ohmic contact 135 opposite the lower conductive layer 110, on the sidewall of the insulating layer 115, and on the insulating layer 115, opposite the lower conductive layer 110. An upper conductive layer 145 is formed on the diffusion barrier layer 140. In another embodiment, the diffusion barrier 140 is not used, and the upper conductive layer 145 is formed directly on the ohmic contact 135, the insulating layer sidewall and on the insulating layer 115 opposite the lower conductive layer 110.

Still referring to FIG. 9, the diffusion barrier preferably comprises a refractory metal compound such as titanium nitride, tungsten nitride, tantalum nitride, zirconium nitride, titanium carbide, tungsten carbide, tantalum carbide or zirconium carbide. Upper conductive layer 145 is preferably a refractory metal such as titanium, cobalt, tungsten, molybdenum, tantalum and zirconium. The upper conductive layer 145 may be deposited using an in situ deposition. Accordingly, diffusion of dopants through the interface between the semiconductor device 110 and the ohmic contact 135 is reduced, as is agglomeration of the titanium silicide and the ohmic contact 135.

Figure 10:
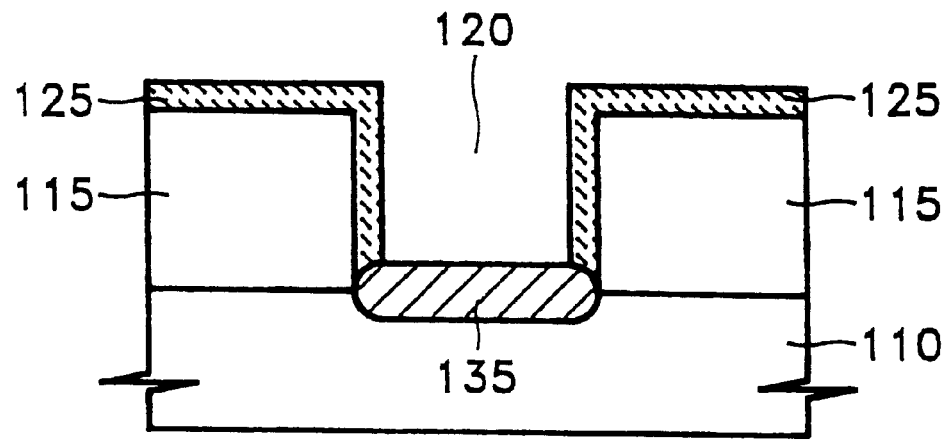
FIGS. 10 and 11 are cross-sectional views of a second embodiment of interconnects for semiconductor devices according to the present invention during intermediate fabrication steps.
Figure 11:
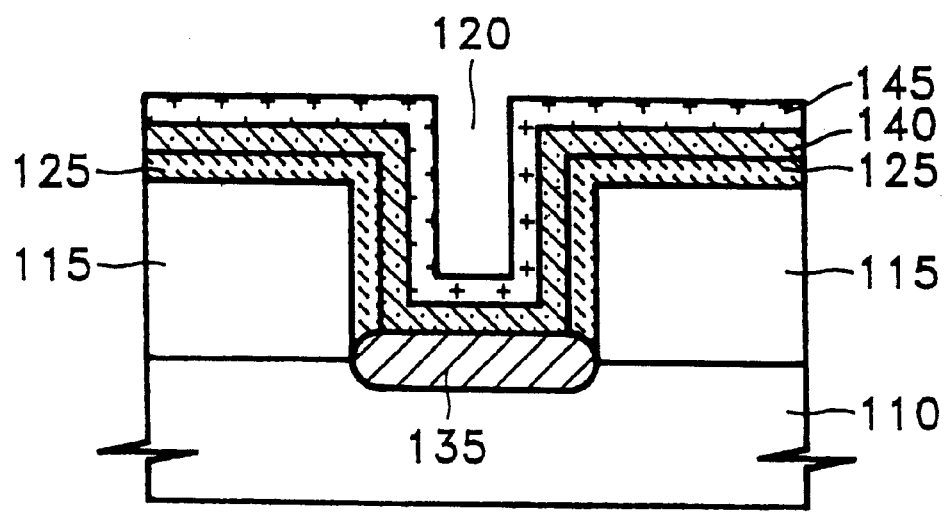

FIGS. 10 and 11 are cross-sectional views of a second embodiment of the invention. The metal interconnect is fabricated as shown in FIGS. 5–7. However, as shown in FIG. 10, only the reactive metal layer is removed. The reaction control layer 125 remains. The exposed surface of the ohmic contact 135 may be etched to remove any oxide film which may be produced thereon.

Then, referring to FIG. 11, a diffusion barrier 140 and an upper conductive layer 145 are formed. The diffusion barrier extends on the ohmic contact 135 opposite the lower conductive layer 110 and on the reaction control layer 125 opposite the insulating layer 115. The upper conductive layer 145 is formed on the diffusion barrier layer 140.

Figure 12:
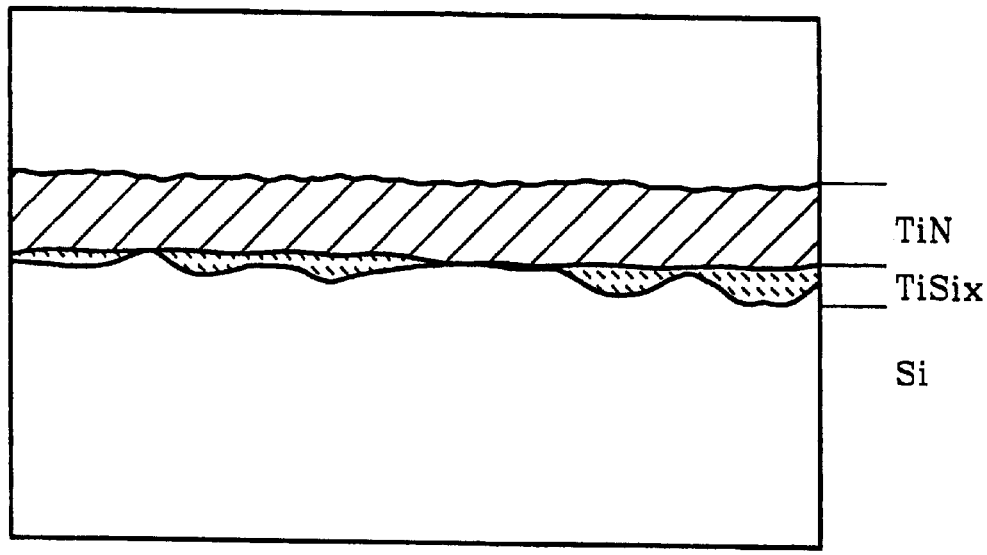
FIGS. 12 and 13 are line drawing of a SEM photographs of conventional interconnect structures and interconnect structures according to the present invention, respectively.
Figure 13:
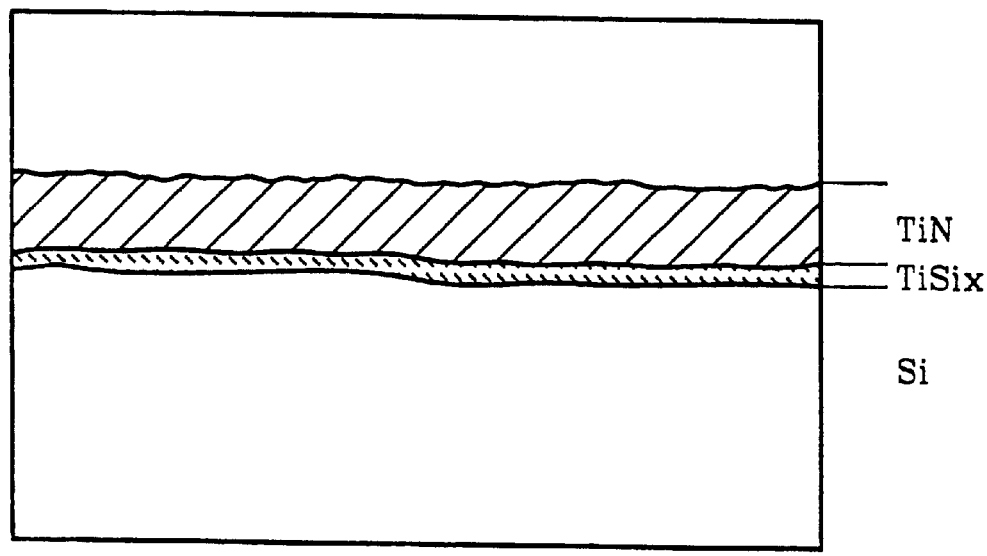
Figure 14:
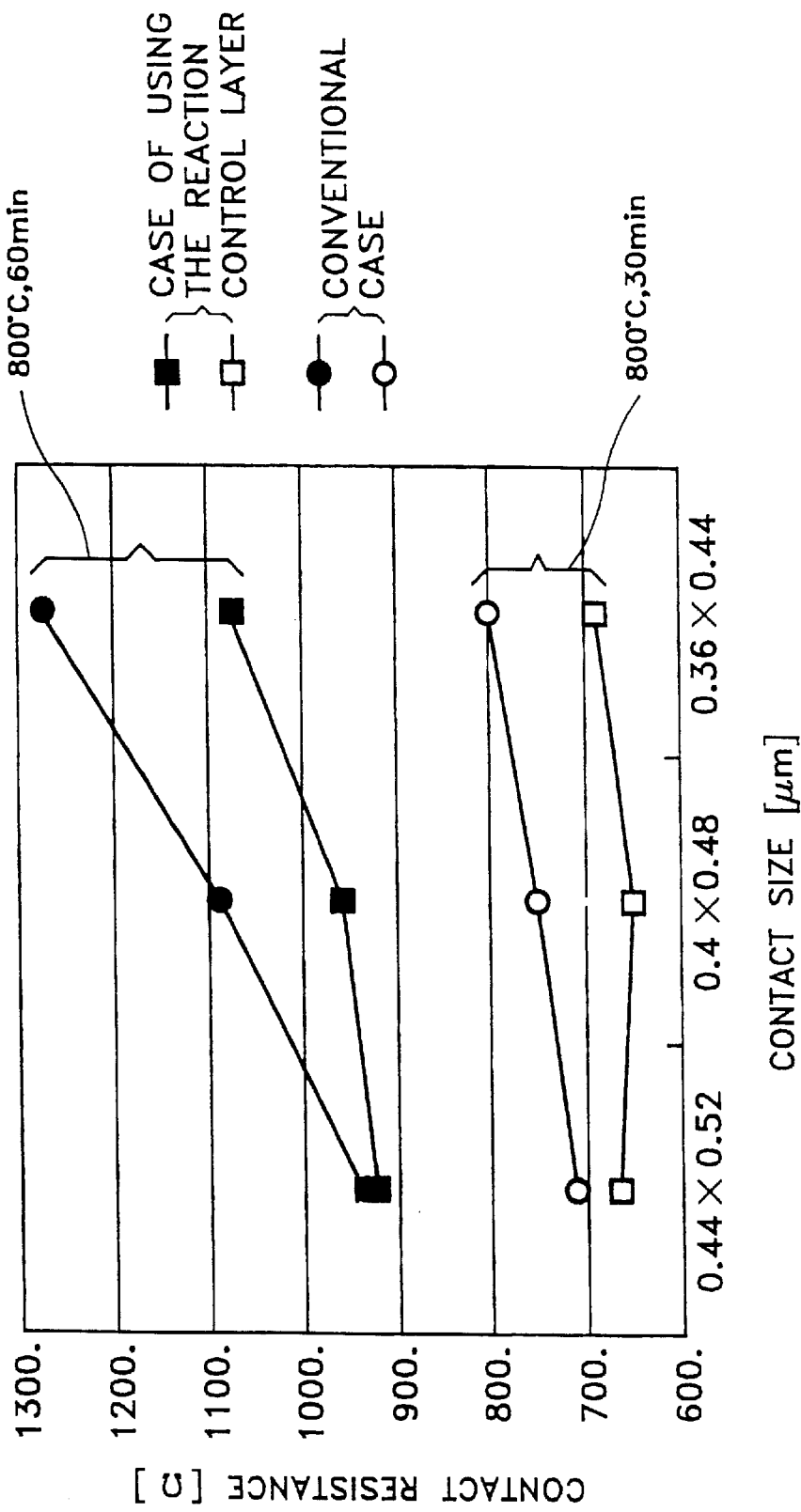
FIG. 14 graphically illustrates the contact resistance of interconnects according to the first embodiment of the present invention.

Referring now to FIGS. 12 and 13, it can be seen that agglomeration of titanium silicide is reduced by the present invention. Moreover, FIG. 14 graphically illustrates changes in contact resistance during a thermal treatment at 800° C. for a period of 30 minutes and a period of 60 minutes. As shown, even for small contact sizes, the present invention provides reduced contact resistance compared to conventional contacts.

Figure 15:
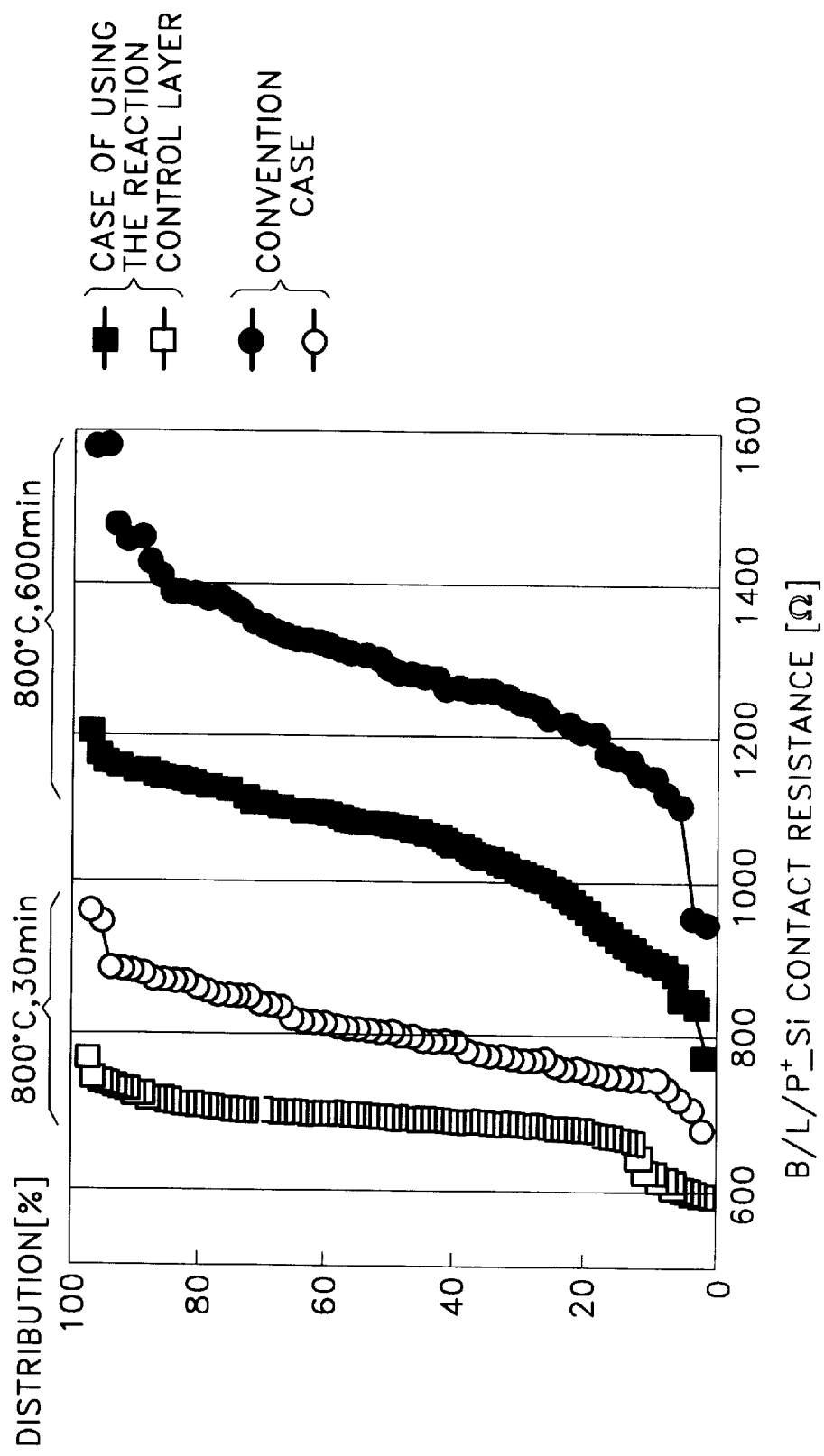
FIG. 15 graphically illustrates the contact resistance of interconnects according to the second embodiment of the present invention.

Referring now to FIG. 15, the contact resistance distribution for a thermal treatment process at 800° C. for a period of 30 minutes and a period of 60 minutes is shown. As shown, the contact resistance is small and the distribution is stable, compared to conventional metal contacts.

Figure 16:
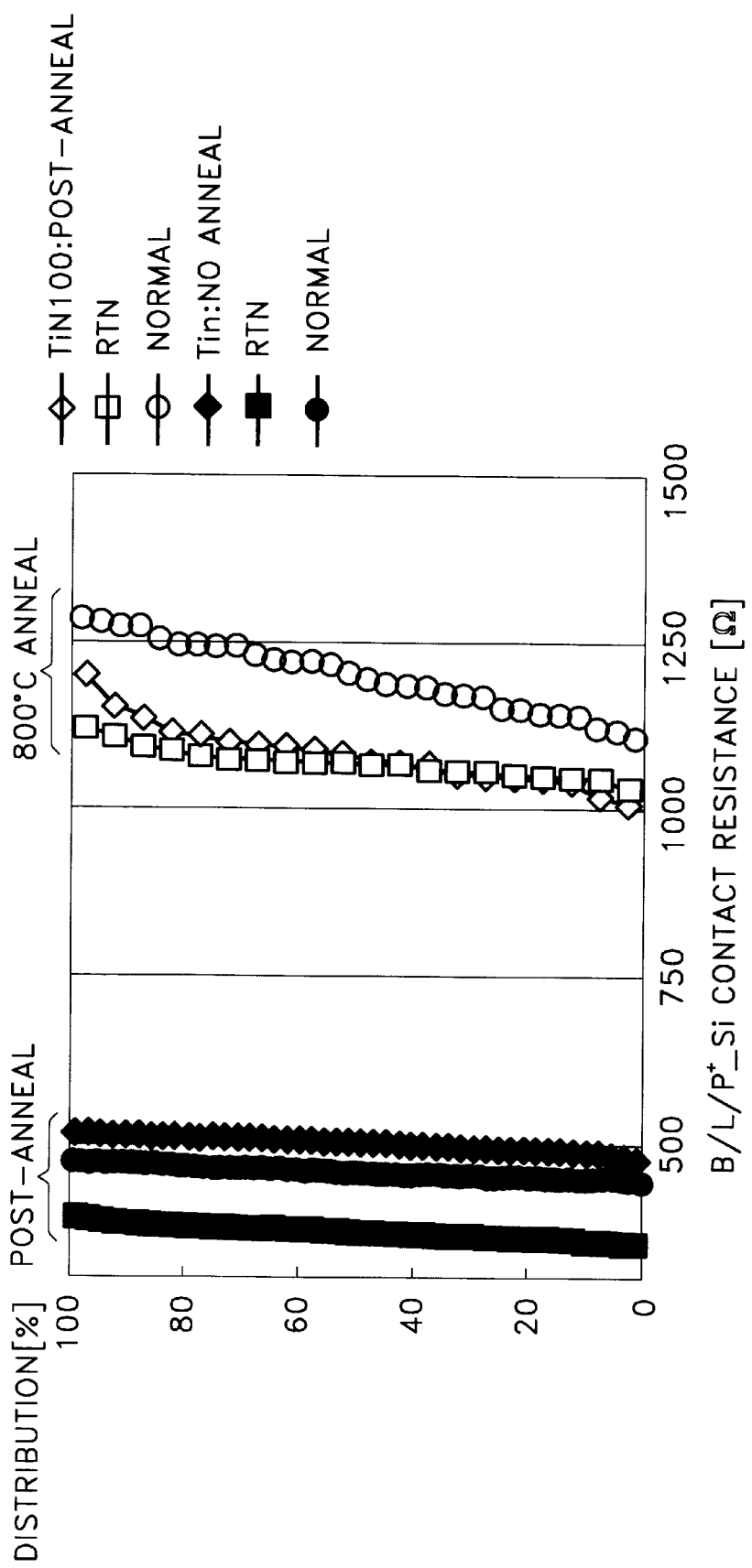
FIGS. 16 and 17 graphically illustrate the contact resistance characteristics of conventional interconnects and interconnects according to the present invention, respectively.

FIG. 16 graphically illustrates the improved contact resistance for interconnects according to the present invention. As shown in FIG. 16, distribution of contact resistance in a control layer such as titanium nitride and a refractory metal such as titanium, which are sequentially deposited on a silicon substrate using in situ deposition to form titanium silicide, is equal to the case of a nitride which is deposited on the surface of a silicon substrate, to thereby form silicon nitride.

Figure 17:
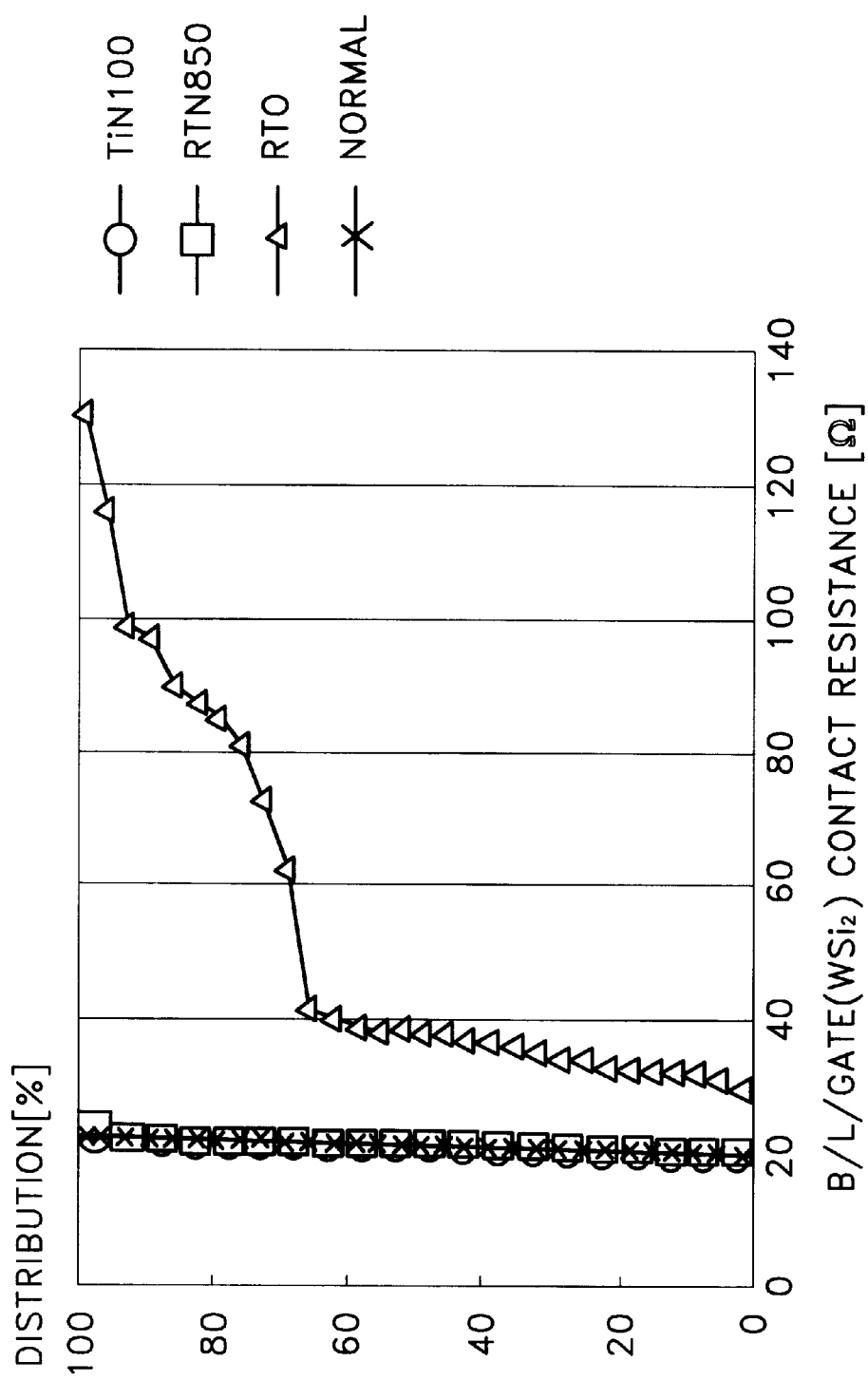

Finally, FIG. 17 graphically illustrates degraded contact resistance of a conventional interconnect. When a rapid thermal oxide dielectric film of silicon dioxide is formed on a gate line of tungsten silicide, the contact resistance between the bit line and the gate line is increased without heat treatment.

In summary, interconnects and interconnect fabrication processes of the present invention can provide reduced diffusion of dopants and reduced agglomeration of titanium silicide. Reduced contact resistance may be provided even after high temperature anneals. Accordingly, high performance interconnect structures and methods may be provided for high density integrated circuit devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming an interconnect for a semiconductor device, comprising the steps of:
    forming a dielectric layer on a lower conductive layer of the semiconductor device, the dielectric layer including a contact hole which exposes a portion of the lower conductive layer;
    forming a reaction control layer comprising a refractory metal compound on the dielectric layer opposite the lower conductive layer and on the exposed portion of the lower conductive layer; then
    forming a reactive metal layer on the reaction control layer comprising a refractory metal compound;
    reacting the exposed portion of the lower conductive layer with the reactive metal layer, through the reaction control layer comprising a refractory metal compound, to form an ohmic contact in the contact hole on the exposed portion of the lower conductive layer;
    removing the reactive metal layer from the dielectric layer opposite the lower conductive layer; and
    forming an upper conductive layer on the ohmic contact; wherein the exposed portion of the lower conductive layer comprises silicon or metal silicide.

2. A method according to claim 1, wherein the reactive metal layer and the upper conductive layer comprise refractory metal.

3. A method according to claim 2, wherein the refractory metal is selected from the group consisting of titanium, cobalt, tungsten, molybdenum, tantalum and zirconium.

4. A method according to claim 1, wherein the refractory metal compound is selected from the group consisting of titanium nitride, tungsten nitride, tantalum nitride and zirconium nitride.

5. A method according to claim 1, wherein the refractory metal compound is selected from the group consisting of titanium carbide, tungsten carbide, tantalum carbide and zirconium carbide.

6. A method according to claim 1, wherein the reaction control layer is thinner than the reactive metal layer.

7. A method according to claim 1, wherein the reacting step is performed in an atmosphere selected from a group consisting of inert gas and antioxidizing atmospheres.

8. A method according to claim 1, wherein the reacting step comprises the step of rapid thermal annealing of the semiconductor device between about 600° C. and about 800° C.

9. A method according to claim 1, wherein the following step is performed between the step of removing the reactive layer and the step of forming an upper conductive layer:
    forming a diffusion barrier on the ohmic contact.

10. A method according to claim 1, wherein the following step is performed between the step of removing the reactive metal layer and forming an upper conductive layer:
    removing the reaction control layer.

11. A method according to claim 10, wherein the following step is performed between the step of removing the reactive metal layer and the step of forming an upper conductive layer:
    forming a diffusion barrier on the ohmic contact.

12. A method according to claim 11, wherein the diffusion barrier comprises a refractory metal compound.

13. A method of forming an interconnect for a semiconductor device, comprising the steps of:
    forming a reaction control layer comprising a refractory metal compound on a lower conductive layer of the semiconductor device; then
    forming a reactive metal layer on the reaction control layer comprising a refractory metal compound, opposite the lower conductive layer;
    reacting the lower conductive layer with the reactive metal layer, through the reaction control layer comprising a refractory metal compound, to form an ohmic contact for the semiconductor device; and
    forming an upper conductive layer on the ohmic contact, opposite the lower conductive layer; wherein the lower conductive layer comprises silicon or metal silicide.

14. A method according to claim 13, wherein the reactive metal layer and the upper conductive layer comprise refractory metal.

15. A method according to claim 14, wherein the refractory metal is selected from the group consisting of titanium, cobalt, tungsten, molybdenum, tantalum and zirconium.

16. A method according to claim 13, wherein the refractory metal compound is selected from the group consisting of titanium nitride, tungsten nitride, tantalum nitride and zirconium nitride.

17. A method according to claim 13, wherein the refractory metal compound is selected from the group consisting of titanium carbide, tungsten carbide, tantalum carbide and zirconium carbide.

18. A method according to claim 13, wherein the reaction control layer is thinner than the reactive metal layer.

19. A method according to claim 13, wherein the reacting step is performed in an atmosphere selected from a group consisting of inert gas and antioxidizing atmospheres.

20. A method according to claim 13, wherein the reacting step comprises the step of rapid thermal annealing of the semiconductor device between about 600° C. and about 800° C.

21. A method according to claim 13, wherein the following step is performed between the step of reacting the semiconductor device and the step of forming an upper conductive layer:

forming a diffusion barrier on the ohmic contact.

22. A method according to claim 13, wherein the following step is performed between the step of reacting the semiconductor device and the step of forming an upper conductive layer:

removing the reaction control layer.

23. A method according to claim 22, wherein the following step is performed between the step of removing the reaction control layer and the step of forming an upper conductive layer:

forming a diffusion barrier on the ohmic contact.

24. A method according to claim 23, wherein the diffusion barrier comprises a refractory metal compound.

25. An interconnect for a semiconductor device including a lower conductive layer, the interconnect comprising:

a dielectric layer on the lower conductive layer, the dielectric layer including a sidewall which defines a contact hole which exposes a portion of the lower conductive layer;

an ohmic contact in the contact hole on the exposed portion of the lower conductive layer;

a reaction control layer comprising a refractory metal compound on the dielectric layer opposite the lower conductive layer, and on the dielectric layer sidewall;

a reactive metal layer on the reaction control layer comprising a refractory metal compound; and an upper conductive layer on the ohmic contact and on the reactive metal layer, opposite the lower conductive layer; wherein the exposed portion of the lower conductive layer comprises silicon or metal silicide.

26. An interconnect according to claim 25, wherein the ohmic contact comprises a meta-stable phase C-49 silicide or a stable phase C-54 silicide.

27. An interconnect according to claim 25, wherein the conductive layer comprises a refractory metal.

28. An interconnect according to claim 27, wherein the refractory metal is selected from the group consisting of titanium, cobalt, tungsten, molybdenum, tantalum and zirconium.

29. An interconnect according to claim 25, wherein the refractory metal compound is selected from the group consisting of titanium nitride, tungsten nitride, tantalum nitride and zirconium nitride.

30. An interconnect according to claim 25, wherein the refractory metal compound is selected from the group consisting of titanium carbide, tungsten carbide, tantalum carbide and zirconium carbide.

31. An interconnect according to claim 25, further comprising:

a diffusion barrier layer between the reaction control layer and the ohmic contact, and the upper conductive layer.

32. An interconnect according to claim 31, wherein the diffusion barrier layer comprises a refractory metal compound.

33. The method according to claim 1, wherein the step of reacting comprises reacting the exposed portion of the lower conductive layer with the reactive metal layer, through the reaction control layer comprising a refractory metal compound, to form an ohmic contact having uniform thickness in the contact hole on the exposed portion of the lower conductive layer.

34. The method according to claim 13, wherein the step of reacting comprises reacting the lower conductive layer with the reactive metal layer, through the reaction control layer comprising a refractory metal compound, to form an ohmic contact having uniform thickness for the semiconductor device.

35. The interconnect according to claim 25, wherein the ohmic contact is of uniform thickness in the contact hole on the exposed portion of the upper conductive layer.

* * * * *